United States Patent
Shibuya et al.

(10) Patent No.: US 7,528,673 B2
(45) Date of Patent: May 5, 2009

(54) OSCILLATOR CIRCUIT AND SEMICONDUCTOR DEVICE HAVING OSCILLATOR CIRCUIT

(75) Inventors: Akihisa Shibuya, Nagasaki (JP); Koji Tsukamoto, Nagasaki (JP); Yasuhide Shimizu, Nagasaki (JP); Tsuyoshi Tanaka, Nagasaki (JP)

(73) Assignee: Sony Corporation, Tokyo (JP)

(*) Notice: Subject to any disclaimer, the term of this patent is extended or adjusted under 35 U.S.C. 154(b) by 499 days.

(21) Appl. No.: 11/225,451

(22) Filed: Sep. 13, 2005

(65) Prior Publication Data

US 2006/0063502 A1    Mar. 23, 2006

(30) Foreign Application Priority Data

Sep. 17, 2004    (JP) .................... P2004-271989

(51) Int. Cl.
*H03K 3/26*    (2006.01)
(52) U.S. Cl. .................. 331/183; 331/143; 331/111
(58) Field of Classification Search .............. 331/183, 331/143, 111
See application file for complete search history.

(56) References Cited

U.S. PATENT DOCUMENTS 3,835,418 A * 9/1974 Gilbert ..................... 331/141
6,064,277 A * 5/2000 Gilbert ..................... 331/117 R

FOREIGN PATENT DOCUMENTS

| JP | 51-74558 | 6/1976 |
| JP | 52-077639 | 6/1977 |
| JP | 59-004331 | 1/1984 |
| JP | 06-606133 | 10/1994 |

OTHER PUBLICATIONS

Japanese Office Action issued on Oct. 23, 2007.

* cited by examiner

*Primary Examiner*—Joseph Chang
(74) *Attorney, Agent, or Firm*—Sonnenschein Nath & Rosenthal LLP

(57) ABSTRACT

An oscillator circuit having a closed loop connection, including: an oscillator for generating an output signal oscillating at a frequency corresponding to a control signal; a frequency/voltage converter for generating a detection signal having a voltage corresponding to a frequency of the output signal; a difference detector for generating a difference signal indicating a difference between the detection signal and a reference signal; and an integrator for generating the control signal by integrating the difference signal.

14 Claims, 5 Drawing Sheets

OSCILLATOR CIRCUIT AND SEMICONDUCTOR DEVICE HAVING OSCILLATOR CIRCUIT

BACKGROUND OF THE INVENTION

1. Field of the Invention

The present invention relates to an oscillator circuit and a semiconductor device having the oscillator circuit.

2. Description of Related Art

Electronic circuits built in conventional various electronic apparatuses often use a reference clock signal oscillating at a constant frequency, and an oscillator circuit is used as a circuit for generating the reference clock signal.

A conventional circuit often used as this oscillator circuit has a structure such as shown in FIG. 9. Namely, an oscillator circuit 101 shown in FIG. 9 has: two comparators CMP101 and CMP102 for comparing an input signal S101 with reference signals S102 and S103 having different voltages; an RS type flip-flop FF101 operating by receiving output signals S104 and S105 of the comparators CMP101 and CMP102; a switching transistor TR101 intermittently operating in response to an output signal S106 from the RS type flip-flop FF101, and a capacitor C101 for generating the input signal S101 through charge/discharge cooperating with the intermittent operation of the switching transistor TR101.

In this oscillator circuit 101, the two comparators CMP101 and CMP102 operate alternately to make the voltage of the input signal S101 generated by the capacitor C101 have a value between the reference signals S102 and S102 having different voltages, and in response to this operation, the RS type flip-flop FF101 outputs the output signal S106 having a predetermined frequency determined by a charge time and a discharge time of the capacitor C101.

Refer to Japanese Patent Application Publication No. 2004-15447.

SUMMARY OF THE INVENTION

However, the above-described conventional oscillator circuit 101 is difficult to generate a high frequency output signal S106 because the oscillator circuit is structured so that the output signal S106 having the predetermined frequency is generated by alternately operating the two comparators CMP101 and CMP102.

Namely, since the comparators CMP101 and CMP102 have essentially a response delay time and an offset voltage, the conventional oscillator circuit 101 is difficult to generate a high frequency output signal S106 with a high precision because of a variation in duty ratios of the output signals to be caused by a variation in response delay times and offset voltages of the comparators CMP101 and CMP102 at a high operation frequency.

In order to generate a high frequency output signal S106, it is necessary to increase an operation current of the comparators CMP101 and CMP102. Therefore, as an operation frequency becomes high, a consumption current of the conventional oscillator circuit 101 increases and the oscillator circuit is difficult to generate a high frequency output signal S106 within a limited supply power.

According to a first embodiment of the present invention, it is provided an oscillator circuit having a closed loop connection including: an oscillator for generating an output signal oscillating at a frequency corresponding to a control signal; a frequency/voltage converter for generating a detection signal having a voltage corresponding to a frequency of the output signal; a difference detector for generating a difference signal indicating a difference between the detection signal and a reference signal; and an integrator for generating the control signal by integrating the difference signal.

According to a second embodiment of the present invention, in the first embodiment, the oscillator has: a relaxation signal generator circuit for generating a relaxation control signal by relaxing a change in the control signal; and an output signal generator circuit for generating the output signal oscillating at a frequency corresponding to the relaxation control signal.

According to a third embodiment of the present invention, in the first or second embodiment, the frequency/voltage converter has: a frequency divider for generating a frequency-divided output signal by frequency-dividing the output signal; and a detection signal generator circuit for generating the detection signal having a voltage corresponding to a frequency of the frequency-divided output signal.

According to a forth embodiment of the present invention, in any of the first to third embodiments, the frequency/voltage converter has: a capacitor for repeating charge and discharge in response to the output signal; and a resistor for converting a current discharged from the capacitor into a voltage of the detection signal.

According to a fifth embodiment of the present invention, in the forth embedment, the frequency/voltage converter has an auxiliary capacitor connected in parallel to the resistor.

According to a sixth embodiment of the present invention, in the forth or fifth embodiment, the reference signal is generated by dividing a power source voltage applied to the capacitor of the frequency/voltage converter.

According to a seventh embodiment of the present invention, in any of the first to sixth embodiments, a signal modulated in a predetermined format is output as the output signal by using a signal modulated in the predetermined format as the reference signal.

According to an eighth embodiment of the present invention, it is provided a semiconductor device having an oscillator circuit formed on a semiconductor substrate, wherein the oscillator circuit has a closed loop connection including: an oscillator for generating an output signal oscillating at a frequency corresponding to a control signal; a frequency/voltage converter for generating a detection signal having a voltage corresponding to a frequency of the output signal; a difference detector for generating a difference signal indicating a difference between the detection signal and a reference signal; and an integrator for generating the control signal by integrating the difference signal.

According to a ninth embodiment of the present invention, in the eighth embodiment, the oscillator has: a relaxation signal generator circuit for generating a relaxation control signal by relaxing a change in the control signal; and an output signal generator circuit for generating the output signal oscillating at a frequency corresponding to the relaxation control signal.

According to a tenth embodiment of the present invention, in the eighth or ninth embodiment, the frequency/voltage converter has: a frequency divider for generating a frequency-divided output signal by frequency-dividing the output signal; and a detection signal generator circuit for generating the detection signal having a voltage corresponding to a frequency of the frequency-divided output signal.

According to an eleventh embodiment of the present invention, in any of the eights to tenth embodiments, the frequency/voltage converter has: a capacitor for repeating charge and discharge in response to the output signal; and a resistor for converting a current discharged from the capacitor into a voltage of the detection signal.

According to a twelfth embodiment of the present invention, in the eleventh embodiment, the frequency/voltage converter has an auxiliary capacitor connected in parallel to the resistor.

According to a thirteenth embodiment of the present invention, in the eleventh or twelfth embodiment, the reference signal is generated by dividing a power source voltage applied to the capacitor of the frequency/voltage converter.

According to a fourteenth embodiment of the present invention, in any of the eighth embodiment to the thirteenth embodiment, a signal modulated in a predetermined format is output as the output signal by using a signal modulated in the predetermined format as the reference signal.

The present invention provides the advantages described below.

Namely, according to the present invention, the oscillator circuit is structured by a closed loop connection of: the oscillator for generating an output signal oscillating at a frequency corresponding to a control signal; the frequency/voltage converter for generating a detection signal having a voltage corresponding to a frequency of the output signal; the difference detector for generating a difference signal indicating a difference between the detection signal and a reference signal; and the integrator for generating the control signal by integrating the difference signal. Accordingly, since the oscillator circuit can be structured without using a comparator having a response delay time, a high frequency output signal can be generated with a high precision without increasing a consumption power.

According to the present invention, the oscillator has the relaxation signal generator circuit for generating a relaxation control signal by relaxing a change in the control signal, and the output signal generator circuit for generating the output signal oscillating at a frequency corresponding to the relaxation control signal. Accordingly, a high frequency output signal can be generated stably.

According to the present invention, the frequency/voltage converter has the frequency divider for generating a frequency-divided output signal by frequency-dividing the output signal, and the detection signal generator circuit for generating the detection signal having a voltage corresponding to a frequency of the frequency-divided output signal. Accordingly, since the frequency range capable of being converted into the detection signal by the frequency/voltage converter 3 can be broadened, a wide band output signal can be generated.

According to the present invention, the frequency/voltage converter has the capacitor for repeating charge and discharge in response to the output signal, and the resistor for converting a current discharged from the capacitor into a voltage of the detection signal. Accordingly, a circuit scale of the frequency/voltage converter can be made small.

According to the present invention, the frequency/voltage converter has the auxiliary capacitor connected in parallel to the resistor. Accordingly, a change in the detection signal during charge/discharge of the capacitor can be relaxed so that the output signal can be generated stably.

According to the present invention, the reference signal is generated by dividing a power source voltage applied to the capacitor of the frequency/voltage converter. Accordingly, the influence of the power source voltage can be cancelled out so that the output signal can be generated stably independently from the value and change range of the power source voltage.

According to the present invention, the signal modulated in a predetermined format is output as the output signal by using the signal modulated in the predetermined format as the reference signal. Accordingly, the output signal modulated in the predetermined format can be generated easily.

DESCRIPTION OF THE EMBODIMENTS

Figure 1:
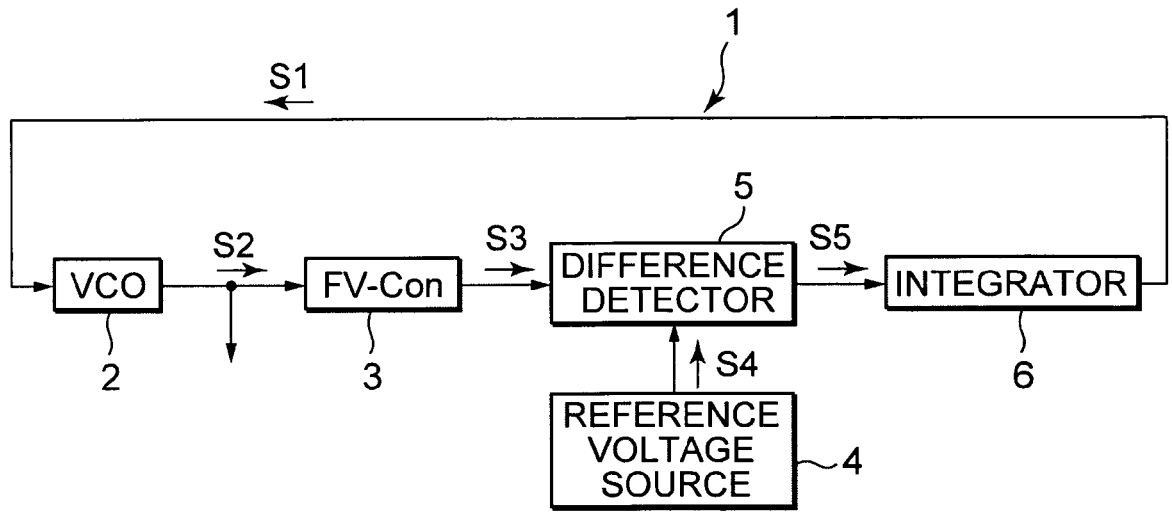
FIG. 1 is a block diagram of an oscillator circuit according to the present invention.

In a semiconductor device having an oscillator circuit according to the present invention, the oscillator circuit is formed on a semiconductor substrate. The semiconductor device is not limited only to a single oscillator device (oscillator IC) but includes also a device (IC) mixing various electronic circuits and an oscillator circuit for generating clock signals to be used by the electronic circuits.

The oscillator circuit according to the present invention has an oscillator, a frequency/voltage converter, a difference detector and an integrator, which are connected in a closed loop, and generates an output signal oscillating at a predetermined frequency.

Description will be made on the function of each element constituting the oscillator circuit. The oscillator generates an output signal oscillating at a frequency corresponding to a control signal. The frequency/voltage converter generates a detection signal having a voltage corresponding to a frequency of the output signal. The difference detector generates a difference signal indicating a difference between the detection signal and a reference signal. The integrator generates the control signal by integrating the difference signal.

As described above, the oscillator circuit according to the present invention has the oscillator for generating an output signal oscillating at a frequency corresponding to a control signal, the frequency/voltage converter for generating a detection signal having a voltage corresponding to a frequency of the output signal, the difference detector for generating a difference signal indicating a difference between the detection signal and a reference signal, and the integrator for generating the control signal by integrating the difference signal, respectively connected in a closed loop.

Therefore, since the oscillator circuit according to the present invention can be structured without using a comparator having a response delay time, it is possible to prevent an increase in a consumption power and a reduction in a frequency precision to be caused by the comparator characteristics such as a response delay time when a high frequency output signal is generated, and to generate a high frequency output signal with a high precision without an increase in the consumption power.

If the oscillator has a relaxation signal generator circuit for generating a relaxation control signal by relaxing a change in the control signal, and an output signal generator circuit for generating the output signal oscillating at a frequency corresponding to the relaxation control signal, noise components contained in the control signal are relaxed so that the output signal is hard to be influenced by the noise components and a high frequency output signal can be generated stably.

Further, if the frequency/voltage converter has a frequency divider for generating a frequency-divided output signal by frequency-dividing the output signal, and a detection signal generator circuit for generating the detection signal having a voltage corresponding to a frequency of the frequency-divided output signal, the frequency of the frequency-divided output signal to be input to the detection signal generator circuit can be lowered. Therefore, a higher frequency output signal can be converted into the detection signal by the frequency/voltage converter so that the frequency range capable of being converted into the detection signal by the frequency/voltage converter can be broadened and a wide band output signal can be generated.

If the frequency/voltage converter has a capacitor (switched capacitor) for repeating charge and discharge in response to the output signal and a resistor for converting a current discharged from the capacitor into a voltage of the detection signal, the circuit structure of the frequency/voltage converter can be simplified so that a circuit scale of the frequency/voltage converter can be made small.

A multistage structure may be used in which a plurality of capacitors (switched capacitors) for repeating charge and discharge in response to the output signal are connected in parallel. In this case, a plurality of capacitors are alternately charged or discharged to flow always a discharge current from the capacitors. Therefore, a change in current discharged from the capacitors can be smoothed so that the oscillation frequency of the oscillator circuit can be stabilized.

If the frequency/voltage converter has an auxiliary capacitor connected in parallel to the resistor, even if the detection signal changes during charge/discharge of the capacitor and charges accumulated in the capacitor become excessive or insufficient, this excessive or insufficient charges can be supplied from the auxiliary capacitor. It is therefore possible to relax a change of the detection signal during charge/discharge of the capacitor so that the oscillator circuit can generate the output signal stably.

If the reference signal is generated by dividing a power source voltage applied to the capacitor of the frequency/voltage converter, the influence of the power source voltage can be cancelled out as viewed from the whole oscillator circuit so that the output signal can be generated stably independently from the value and change range of the power source voltage.

If a signal modulated in a predetermined format is used as the output signal by using a signal modulated in the predetermined format as the reference signal, it is possible to generate the output signal modulated in the same format as that of the reference signal modulated in the predetermined format. Accordingly, the output signal modulated in the predetermined format can be generated easily.

In the following, with reference to the accompanying drawings, description will be made on specific structures of an oscillator circuit according to the present invention.

Figure 2:
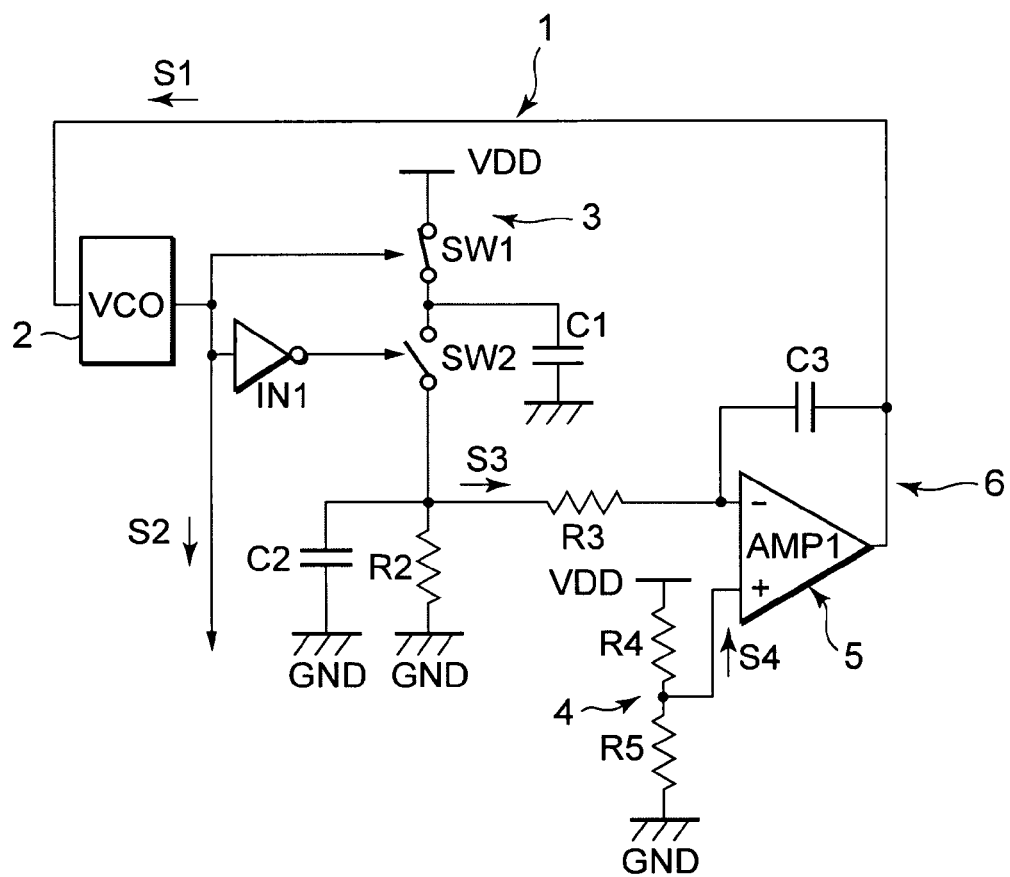
FIG. 2 is a circuit diagram of the oscillator circuit.
Figure 3:
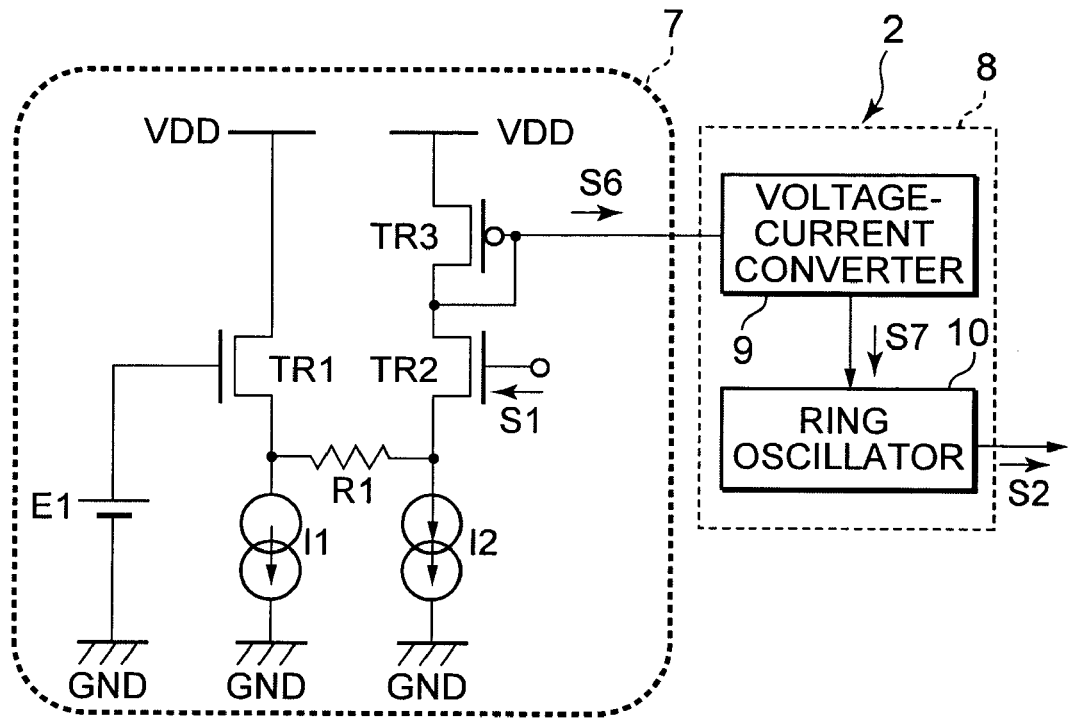
FIG. 3 is a circuit diagram of an oscillator.

As shown in FIGS. 1 to 3, an oscillator circuit 1 has a closed loop connection of: an oscillator 2 for generating an output signal S2 oscillating at a frequency corresponding to a voltage of a control signal S1; a frequency/voltage converter 3 for generating a detection signal S3 having a voltage corresponding to a frequency of the output signal S2; a difference detector 5 for generating a difference signal S5 indicating a voltage difference between a reference signal S4 having a constant voltage generated by a reference voltage source 4 and the detection signal S3; and an integrator 6 for generating the control signal S1 by integrating the difference signal S5 for a predetermined time.

In the oscillator circuit 1, the frequency/voltage converter 3 converts the frequency of the output signal S2 generated by the oscillator 2 into the detection signal S3 as a voltage signal. The difference detector 5 calculates the voltage difference between the detection signal S3 and reference signal S4 to generate the difference signal S5. The integrator 6 integrates the difference signal S5 to generate the control signal S1 which is negative-feedback to the oscillator 2.

Since negative feedback is applied to the oscillator 2, the voltage difference between the detection signal S3 and reference signal S4 becomes zero and the output signal S2 is generated having a frequency corresponding to the detection signal S3 having the same voltage as that of the reference signal S4.

In this manner, the oscillator circuit 1 can be structured without using a comparator having a response delay time. It is therefore possible to prevent an increase in a consumption power and a reduction in a frequency precision to be caused by the comparator characteristics such as a response delay time when a high frequency output signal is generated, and to generate a high frequency output signal S2 with a high precision without an increase in the consumption power.

Description will be made on each constituent element of the oscillator circuit 1. As shown in FIG. 3, the oscillator 2 is constituted of: a relaxation signal generator circuit 7 for generating a relaxation control signal S6 by relaxing a voltage change of the control signal S1; and an output signal generator circuit 8 for generating the output signal S2 having a frequency corresponding to a voltage of the relaxation control signal S6.

The relaxation signal generator circuit 7 is constituted of a gm control circuit. More specifically, a resistor R1 is connected between sources of transistors TR1 and TR2, and constant current circuits I1 and I2 are connected between the sources of the transistors TR1 and TR2 and a ground terminal GND to flow equal currents.

Also in the relaxation signal generator circuit 7, a power source terminal VDD is connected to a drain of the transistor TR1 and a voltage source E1 having a constant voltage is connected to a gate of the transistor TR1. The power source terminal VDD is connected to a drain of the transistor TR2 via a diode-connected transistor TR3, and an integrator 6 is connected to a gate of the transistor TR2 to apply the control signal S1 to the gate. A transistor TR3 outputs the relaxation control signal S6 form the shorted gate and drain.

Figure 4:
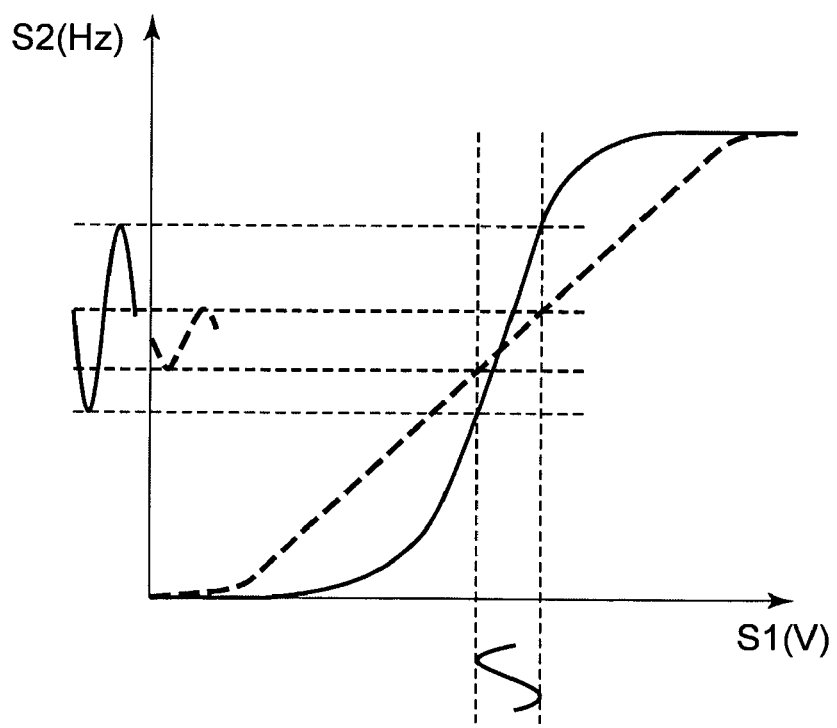
FIG. 4 is a diagram illustrating an operation of a relaxation signal generator circuit.

As shown in FIG. 3, the relaxation signal generator circuit 7 operates to remove a voltage difference between the voltage of the control signal S1 and the voltage of the voltage source E1. In this case, the resistor R1 connected between the sources of the transistors TR1 and TR2 forming a differential pair relaxes a voltage change of the control signal S1 to generate the relaxation control signal S6 which gently changes around the voltage of the voltage source E1. In FIG. 4, for the purposes of comparison, the control signal S1 and output signal S2 are indicated by broken lines with the involvement of the relaxation signal generator circuit 7, and by solid lines without the involvement of the relaxation signal generator circuit 7.

The output signal generator circuit 8 is constituted of: a well-known voltage/current converter 9 for converting a voltage of the relaxation control signal S6 into an intermediate signal S7 as a current signal; and a well-known ring oscillator 10 for outputting the output signal S2 having a frequency corresponding to a current of the intermediate signal S7.

The oscillator 2 has, as described above, the relaxation signal generator circuit 7 for generating the relaxation control signal S6 by relaxing a voltage change of the control signal S1 and the output signal generator circuit 8 for generating the output signal oscillating at a frequency corresponding to the relaxation control signal S6. Therefore, noise components contained in the control signal S1 are relaxed so that the output signal S2 is hard to be influenced by the noise components and the high frequency output signal S2 can be generated stably.

As shown in FIG. 2, the frequency/voltage converter 3 constituting the oscillator circuit 1 is constituted of a switched capacitor circuit. More specifically, an inverter IN1 inverts the output signal S2 to generate an inverted output signal, a switch SW1 to be turned on and off by the output signal S2 is connected to the power source terminal VDD, a switch SW2 to be turned on and off by the inverted output signal is serially connected to the switch SW1, a charge/discharge capacitor C1 is connected between the connection point between the these switches SW1 and SW2 and the ground terminal GND, a resistor R2 is connected between the switch SW2 and ground terminal GND, and an auxiliary capacitor C2 is connected in parallel to the resistor R2.

In the frequency/voltage converter 3, the two switches SW1 and SW2 are alternately turned on or off by the output signal S2 and inverted output signal to make the capacitor C1 charge and discharge, and the resistor R2 converts a change in a charge amount discharged from the capacitor C1 into a voltage to generate the detection signal S3 having the voltage corresponding to the frequency of the output signal S2.

As described above, the frequency/voltage converter 3 has the capacitor C1 repeating charge and discharge in response to the output signal S2 and the resistor R2 for converting the current generated through charge or discharge of the capacitor C1 into the voltage of the detection signal S3.

The circuit structure of the frequency/voltage converter 3 can therefore be simplified so that the circuit scale can be made small.

Further, in the frequency/voltage converter 3, the auxiliary capacitor C2 is connected in parallel to the resistor R2.

Therefore, in the frequency/voltage converter 3, even if the detection signal S3 changes during charge/discharge of the capacitor C1 and charges accumulated in the capacitor C1 become excessive or insufficient, this excessive or insufficient charges can be supplied from the auxiliary capacitor C2. It is therefore possible to relax a change of the detection signal S3 during charge/discharge of the capacitor C1, whereby the oscillator circuit 1 can generate the output signal S2 stably.

In the difference detector 5 and integrator 6 constituting the oscillator circuit 1, as shown in FIG. 2, an output terminal (connection point between the resistor R2 and switch SW2) of the frequency/voltage converter 3 is connected to an inverting input terminal of an amplifier AMP via a resistor R3, a capacitor C3 is inserted into a feedback path between the output terminal and inverting input terminal of the amplifier AMP1, and the output terminal of the amplifier AMP1 is connected to the oscillator 2.

In the reference voltage source 4 constituting the oscillator circuit 1, as shown in FIG. 2, two serially connected resistors R4 and R5 are connected between the power source terminal VDD and ground terminal GND, and a connection point between the resistors R4 and R5 is connected to a non-inverting input terminal of the amplifier AMP1.

As described above, in the oscillator circuit 1, a power source voltage Vdd at the power source terminal VDD is applied to the capacitor C1 of the frequency/voltage converter 3 to charge the capacitor C1, and the reference signal S4 is generated by dividing the power source voltage Vdd by the resistors R4 and R5.

Therefore, in the oscillator circuit 1, the influence of the power source voltage Vdd can be cancelled out as viewed from the whole circuit, whereby the output signal S2 can be generated stably independently from the voltage value and change range of the power source voltage Vdd.

Namely, by representing a capacitance of the capacitor C1 by c and a voltage of the detection signal S3 by V3, charges Q charged in the capacitor C1 are expressed by:

$Q = c \cdot (Vdd - V3)$

By differentiating this equation by time t, a current during the charge is expressed by:

$i1 = c \cdot (Vdd - V3)/t$

This current i1 is a charge current of the capacitor C1. One cycle of change and discharge of the capacitor C1 is completed in one period of the output signal S2. If a duty ratio of the output signal S2 is 50%, charges charged in the capacitance c are equal to charges discharged from the capacitance c. Therefore, a current during discharge is equal to a current during charge. By representing a charge time and a discharge time by T, one period of the output signal is 2T. Therefore:

$i = c \cdot (Vdd - V3)/(2 \cdot T)$

By representing the frequency of the output signal S2 by f, this 2·T is expressed by:

$2 \cdot T = 1/f$

Therefore, a current i flowing during one period of the output signal S2 can be expressed by:

$i = c \cdot (Vdd - V3) \cdot f$

Therefore, by representing a resistance value of the resistor R2 by r2, the voltage V3 of the detection signal S3 can be expressed by:

$V3 = i \cdot r2$

By substituting the above-described equation, V3 is expressed by:

$V3 = c \cdot (Vdd - V3) \cdot f \cdot r2$

If the voltage V3 of the detection signal S3 is equal to the voltage V4 of the reference signal S4, then:

$V4 = c \cdot (Vdd - V4) \cdot f \cdot r2$

By modifying this:

$f = V4/(c \cdot (Vdd - V4) \cdot r2)$

By further modifying this:

$f = 1/(c \cdot (Vdd/V4 - 1) \cdot r2)$

By representing the resistance values of the resistors R4 and R5 by r4 and r5, the voltage V4 of the reference signal S4 can be expressed by:

$V4 = Vdd \cdot r5/(r4 + r5)$

Therefore, by substituting V4 into the above-described equation:

$f = 1/(c \cdot (Vdd/(Vdd \cdot r5/(r4 + r5)) - 1) \cdot r2)$

By modifying this:

$f = r5/(c \cdot r2 \cdot r4)$

In the oscillator circuit 1, therefore, by applying the power source voltage Vdd at the power source terminal VDD to the capacitor C1 of the frequency/voltage converter 3 to charge the capacitor C1 and generating the reference signal S4 by dividing the power source voltage Vdd by the resistors R4 and R5, the frequency of the output signal S2 becomes irrelevant to the power source voltage Vdd as indicated by the above-described equation and is determined by the resistance values r2, r4 and r5 and the capacitance c of the resistors R2, R4 and R5 and capacitor C1, respectively, which can be formed on a semiconductor substrate at a high precision.

Therefore, in the oscillator circuit 1, the influence of the power source voltage Vdd can be cancelled out as viewed from the whole circuit, whereby the output signal S2 can be generated stably independently from the voltage value and change range of the power source voltage Vdd.

Although the oscillator circuit 1 has the structure described above, the specific structure of each constituent element is not limited thereto if the structure has the above-described functions.

Figure 5:
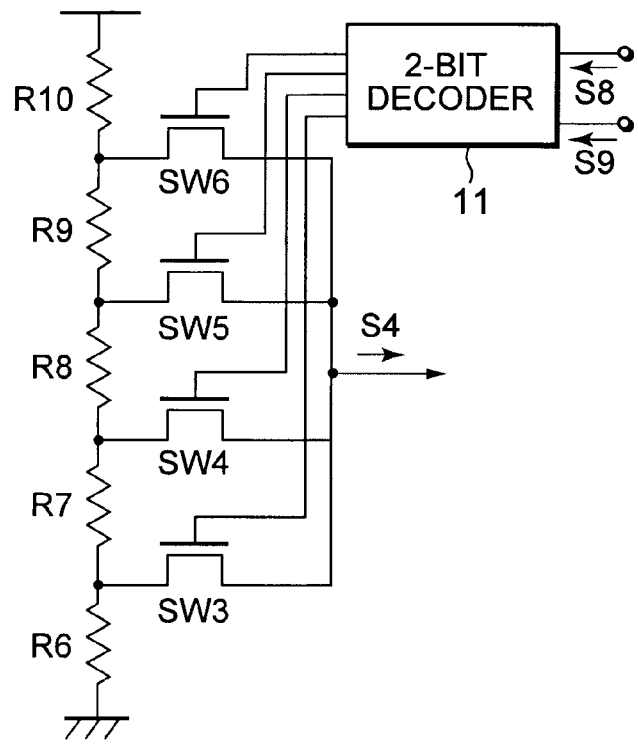
FIG. 5 is a circuit diagram showing a reference voltage source.

For example, the reference voltage source 4 is not limited only to generating the reference signal S4 having always a constant voltage. As shown in FIG. 5, a structure that the reference voltage S4 having a plurality of voltages is generated by using external signals S8 and S9 to change the frequency of the output signal S2 by the external signals S8 and S9.

In the reference voltage source 4 shown in FIG. 5, five resistors R6 to R10 are serially connected between the power source terminal VDD and ground terminal GND, input terminals of switches (switching transistors) SW3 to SW6 are connected to connection points between the resistors R6 to R10, and a decoder 11 for decoding the external signals S8 and S9 of two-bit is connected to a control terminal of each of the switches SW3 to SW6 to output the reference signal S4 from output terminals of the switches SW3 to SW6.

Figure 6:
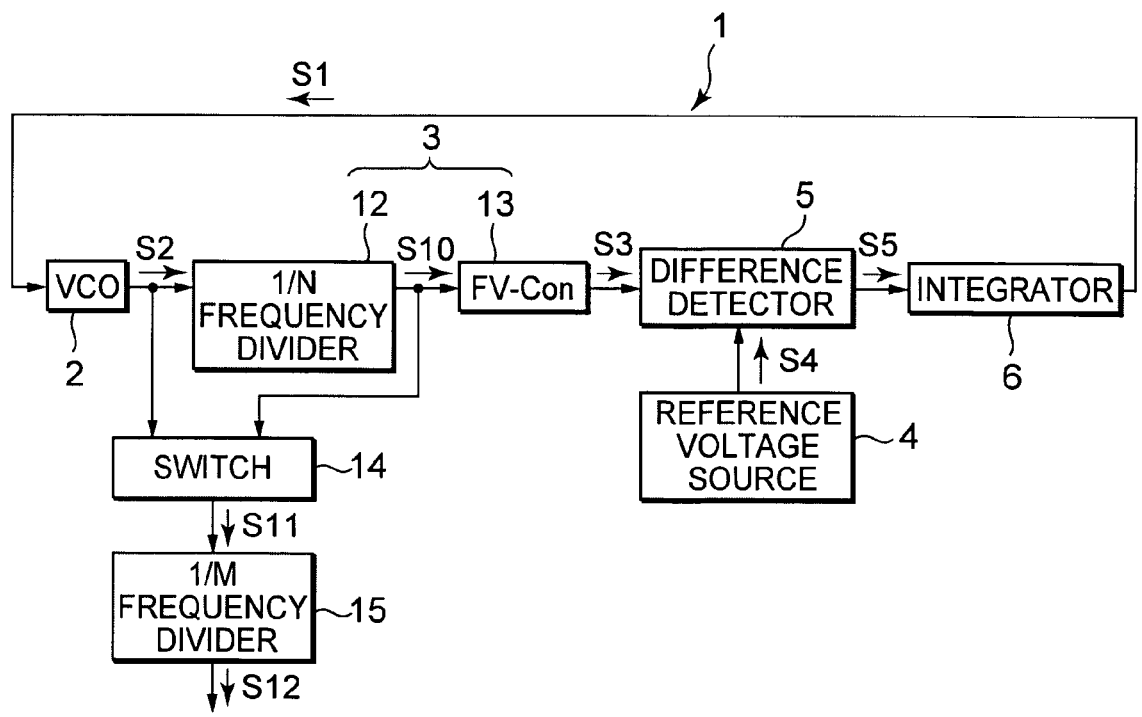
FIG. 6 is a block diagram of another oscillator circuit.

As shown in FIG. 6, the frequency/voltage converter 3 may be constituted of a frequency divider 12 for generating a frequency-divided output signal S10 having a 1/n-fold frequency of the frequency of the output signal S2, by frequency-dividing the output signal S2 by 1/n and a detection signal generator 13 for generating the detection signal S3 having a voltage corresponding to the frequency of the frequency-divided output signal S10. The detection signal generator 13 may have the circuit structure similar to that of the frequency/voltage converter 3 shown in FIG. 2.

As described above, by providing the frequency/voltage converter 3 with the frequency divider 12 for generating the frequency-divided output signal S10 by frequency-dividing the output signal S2 and with the detection signal generator 13 for generating the detection signal S3 having the voltage corresponding to the frequency of the frequency-divided output signal S10, the frequency of the frequency-divided output signal S10 to be input to the detection signal generator 13 can be lowered. Therefore, a higher frequency output signal S2 can be converted into the detection signal S3 by the frequency/voltage converter 3, whereby the frequency range capable of being converted into the detection signal S3 by the frequency/voltage converter 3 can be broadened and a wide band output signal S2 can be generated.

In the oscillator circuit 1 shown in FIG. 6, the output signal S2 may not be output directly. Instead, one of the output signal S2 and a frequency-divided output signal S10 obtained by frequency-dividing the output signal S2 by a frequency divider 12 is output as an intermediate output signal S11 from a switch 14, and this intermediate output signal is further frequency-divided by 1/m by a frequency divider 15 to generate a final output signal S12 to be output.

In this case, the final output signal S12 having a plurality of frequencies can be output through switching of the switch 14.

Figure 7:
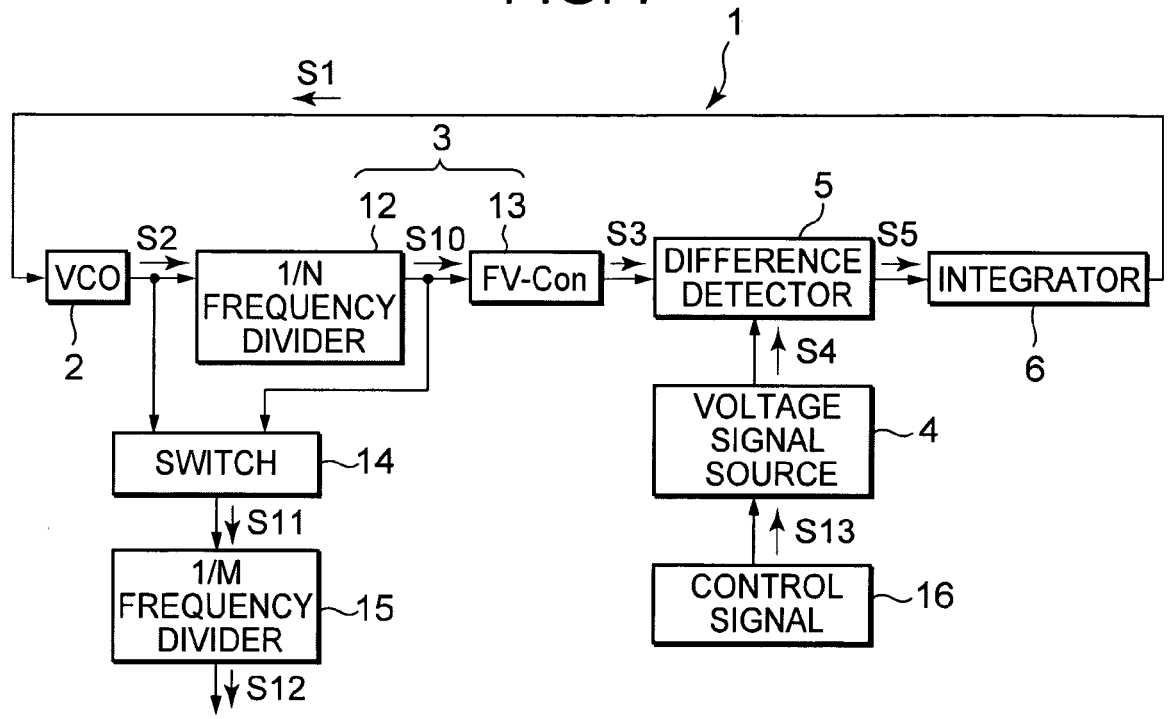
FIG. 7 is a block diagram of another oscillator circuit.

In an oscillator circuit 1 shown in FIG. 7, a control signal generator 16 generates a control signal S13 having a waveform as a reference for modulation in a predetermined format, in accordance with the control signal S13, a voltage signal source 4 generates a reference signal S4 having a waveform as the reference for modulation in the predetermined format, and negative feedback is applied by comparing the reference signal S4 with the detection signal S3.

The oscillator circuit 1 can therefore generate the output signal S2 modulated in the predetermined format corresponding to the reference signal S4.

As described above, in the oscillator circuit 1 shown in FIG. 7, by using as the reference signal S4 a signal modulated in the predetermined format, a signal modulated in the predetermined format can be output as the output signal S2. Since it is possible to generate the output signal S2 modulated in the same format as that of the reference signal S4 modulated in the predetermined format, it is easy to generate the output signal S2 modulated in the predetermined format.

Figure 8:
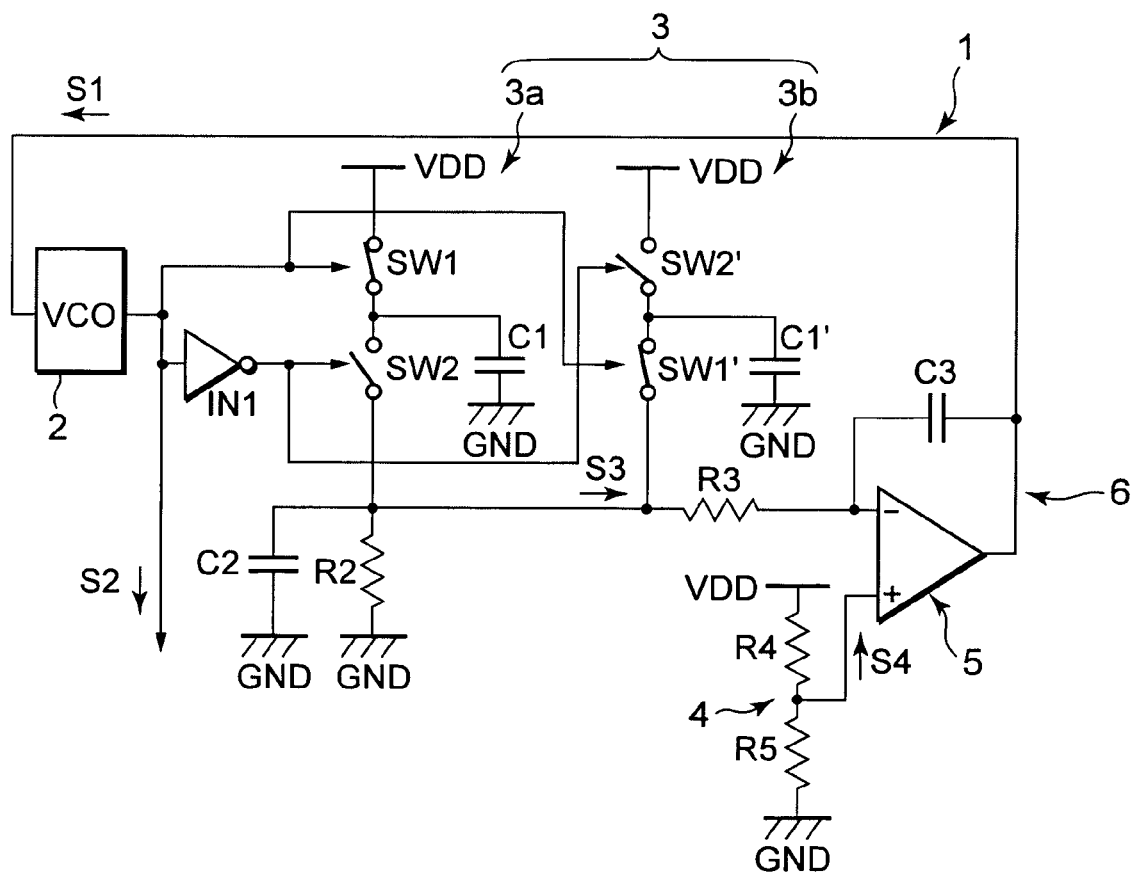
FIG. 8 is a circuit diagram of the other oscillator circuit.
Figure 9:
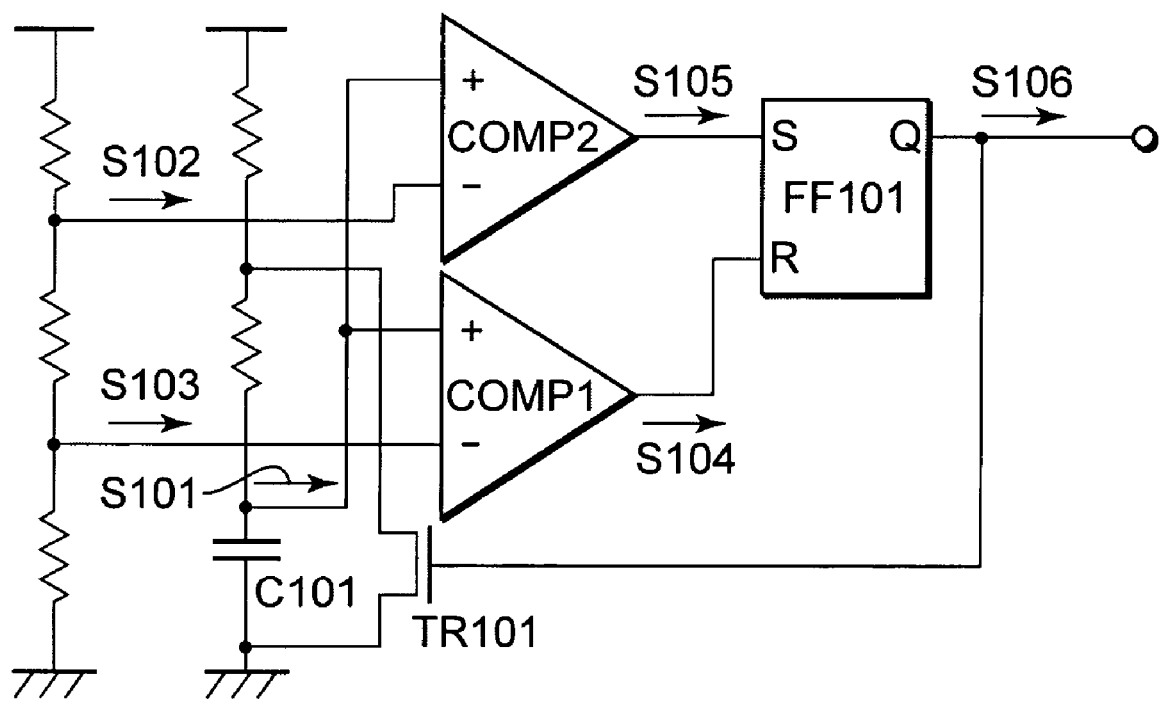
FIG. 9 is a circuit diagram of a conventional oscillator circuit.

In an oscillator circuit 1 shown in FIG. 8, a multistage structure circuit having parallel-connected two capacitors C1 and C1' is used as the switched capacitor circuit repeating charge and discharge in response to the output signal S2.

Namely, as shown in FIG. 8, a frequency/voltage converter 3 of the oscillation circuit 1 is constituted of a two-stage switched capacitor circuit. More specifically, the two-stage switched capacitor circuit has the fundamental structure similar to that of the oscillator circuit 1 shown in FIG. 2, a switch SW2' to be turned on and off by an inverted output signal, which is the output signal S2 inverted, is connected to the power source terminal VDD, a switch SW1' to be turned on and off by the output signal S2 is serially connected to the switch SW2', a charge/discharge capacitor C1' is connected between the connection point between the switches SW1' and SW2' and the ground terminal GND, and a switch SW1' is connected to a resistor R2.

In the frequency/voltage converter 3, the output signal S2 and inverted output signal alternately turn on or off two pairs of switches SW1 and SW2, SW1' and SW2' to make one pair of capacitors C1 and C1∝ alternately charge and discharge, a change in a charge amount discharged from the capacitor C1 or C1' is converted into a voltage by the resistor R2 to thereby generate the detection signal S3 having a voltage corresponding to the frequency of the output signal S2.

As described above, in the oscillator circuit 1 shown in FIG. 8, two capacitors C1 and C1' are alternately charged or discharged to flow always a discharge current from the capacitors C1 and C1'. Therefore, a change in current discharged from the capacitors C1 and C1' can be made small to stabilize the oscillation frequency of the oscillator circuit 1.

It should be understood by those skilled in the art that various modifications, combinations, sub-combinations and alterations may occur depending on design requirements and other factors insofar as they are within the scope of the appended claims or the equivalents thereof.

The present invention contains subject matter related to Japanese Patent Application JP2004-271989, filed in the Japanese Patent Office on Sep. 17, 2004, the entire contents of which being incorporated herein by reference.

What is claimed is:

1. An oscillator circuit having a closed loop connection, comprising:
    an oscillator for generating an output signal oscillating at a frequency corresponding to a control signal, the oscillator comprising (a) a relaxation signal generator circuit for generating a relaxation control signal by relaxing a change in the control signal and (b) an output signal generator circuit for generating the output signal oscillating at a frequency corresponding to the relaxation control signal;

a frequency/voltage converter for generating a detection signal having a voltage corresponding to a frequency of the output signal;

a difference detector for generating a difference signal indicating a difference between the detection signal and a reference signal; and an integrator for generating the control signal by integrating the difference signal.

2. The oscillator circuit according to claim 1,
wherein the frequency/voltage converter comprises:
a frequency divider for generating a frequency-divided output signal by frequency-dividing the output signal; and
a detection signal generator circuit for generating the detection signal having a voltage corresponding to a frequency of the frequency-divided output signal.

3. The oscillator circuit according to claim 1,
wherein the frequency/voltage converter comprises:
a capacitor for repeating charge and discharge in response to the output signal; and
a resistor for converting a current discharged from the capacitor into a voltage of the detection signal.

4. The oscillator circuit according to claim 3,
wherein the frequency/voltage converter comprises an auxiliary capacitor connected in parallel to the resistor.

5. The oscillator circuit according to claim 3,
wherein the reference signal is generated by dividing a power source voltage applied to the capacitor of the frequency/voltage converter.

6. The oscillator circuit according to claim 1,
wherein a signal modulated in a predetermined format is output as the output signal by using a signal modulated in the predetermined format as the reference signal.

7. A semiconductor device having an oscillator circuit formed on a semiconductor substrate, the oscillator circuit having a closed loop connection, the semiconductor device comprising:

an oscillator for generating an output signal oscillating at a frequency corresponding to a control signal, the oscillator comprising (a) a relaxation signal generator circuit for generating a relaxation control signal by relaxing a change in the control signal and (b) an output signal generator circuit for generating the output signal oscillating at a frequency corresponding to the relaxation control signal;

a frequency/voltage converter for generating a detection signal having a voltage corresponding to a frequency of the output signal;

a difference detector for generating a difference signal indicating a difference between the detection signal and a reference signal; and an integrator for generating the control signal by integrating the difference signal.

8. The semiconductor device according to claim 7,
wherein the frequency/voltage converter comprises:
a frequency divider for generating a frequency-divided output signal by frequency-dividing the output signal; and
a detection signal generator circuit for generating the detection signal having a voltage corresponding to a frequency of the frequency-divided output signal.

9. The semiconductor device according to claim 7,
wherein the frequency/voltage converter comprises:
a capacitor for repeating charge and discharge in response to the output signal; and
a resistor for converting a current discharged from the capacitor into a voltage of the detection signal.

10. The semiconductor device according to claim 9,
wherein the frequency/voltage converter comprises an auxiliary capacitor connected in parallel to the resistor.

11. The semiconductor device according to claim 9,
wherein the reference signal is generated by dividing a power source voltage applied to the capacitor of the frequency/voltage converter.

12. The semiconductor device according to any of claims 7 and 8-10,
wherein a signal modulated in a predetermined format is output as the output signal by using a signal modulated in the predetermined format as the reference signal.

13. An oscillator circuit having a closed loop connection, comprising:
an oscillator for generating an output signal oscillating at a frequency corresponding to a control signal;
a frequency/voltage converter for generating a detection signal having a voltage corresponding to a frequency of the output signal;
a difference detector for generating a difference signal indicating a difference between the detection signal an a reference signal; and
an integrator for generating the control signal by integrating the difference signal,
wherein,
the frequency/voltage converter comprises a capacitor for repeating charge and discharge in response to the output signal, and
the reference signal is generated by dividing a power source voltage applied to the capacitor of the frequency/voltage converter.

14. An oscillator circuit having a closed loop connection, comprising:
an oscillator for generating an output signal oscillating at a frequency corresponding to a control signal;
a frequency/voltage converter for generating a detection signal having a voltage corresponding to a frequency of the output signal;
a difference detector for generating a difference signal indicating a difference between the detection signal an a reference signal; and
an integrator for generating the control signal by integrating the difference signal,
wherein,
the frequency/voltage converter comprises (a) a first capacitor for repeating charge and discharge in response to the output signal, (b) a second capacitor for repeating charge and discharge in response to the inverted output signal, and (c) a resistor for converting a current discharged from the capacitors into a voltage of the detection signal.

* * * * *